US007607057B2

(12) United States Patent
Boike et al.

(10) Patent No.: US 7,607,057 B2
(45) Date of Patent: Oct. 20, 2009

(54) TEST WRAPPER INCLUDING INTEGRATED SCAN CHAIN FOR TESTING EMBEDDED HARD MACRO IN AN INTEGRATED CIRCUIT CHIP

(75) Inventors: Mark Allen Boike, Plano, TX (US); Seshagiri Prasad Kalluri, Richardson, TX (US); Vijayanand J. Angarai, Richardson, TX (US); David Mark Brantley, Flower Mound, TX (US); Scott Avery Beeker, Coppell, TX (US)

(73) Assignee: LSI Corporation, Milpitas, CA (US)

( * ) Notice: Subject to any disclaimer, the term of this patent is extended or adjusted under 35 U.S.C. 154(b) by 296 days.

(21) Appl. No.: 11/023,731

(22) Filed: Dec. 28, 2004

(65) Prior Publication Data

US 2006/0156100 A1    Jul. 13, 2006

(51) Int. Cl.
*G01R 31/28* (2006.01)
(52) U.S. Cl. .................... 714/727; 714/30; 714/724; 714/729; 716/4
(58) Field of Classification Search ....................... None
See application file for complete search history.

(56) References Cited

U.S. PATENT DOCUMENTS

| | | | | |
|---|---|---|---|---|
| 5,285,153 A * | 2/1994 | Ahanin et al. | ............... | 324/73.1 |
| 5,303,246 A * | 4/1994 | Anderson et al. | ........... | 714/727 |
| 5,323,400 A * | 6/1994 | Agarwal et al. | ............. | 714/728 |
| 5,774,476 A * | 6/1998 | Pressly et al. | ................ | 714/726 |
| 5,872,793 A * | 2/1999 | Attaway et al. | ............. | 714/726 |
| 5,889,788 A * | 3/1999 | Pressly et al. | ................ | 714/726 |
| 5,894,482 A * | 4/1999 | Motohara | .................... | 714/733 |
| 6,484,280 B1 * | 11/2002 | Moberly | ...................... | 714/726 |
| 6,701,476 B2 * | 3/2004 | Pouya et al. | ................. | 714/727 |
| 6,948,105 B2 * | 9/2005 | Rajsuman | .................... | 714/724 |
| 6,970,815 B1 * | 11/2005 | Bombal et al. | ................. | 703/15 |
| 7,058,918 B2 * | 6/2006 | Abramovici et al. | .......... | 716/12 |
| 7,137,086 B2 * | 11/2006 | Abramovici | .................... | 716/4 |
| 2002/0184583 A1 * | 12/2002 | Hikone et al. | ............... | 714/726 |
| 2003/0056163 A1 * | 3/2003 | Rajsuman et al. | ............ | 714/724 |
| 2004/0054948 A1 * | 3/2004 | McLaurin et al. | ........... | 714/726 |
| 2005/0055615 A1 * | 3/2005 | Agashe et al. | ............... | 714/727 |
| 2005/0138511 A1 * | 6/2005 | Benware | ...................... | 714/727 |
| 2005/0273677 A1 * | 12/2005 | Kinkade et al. | ............. | 714/718 |
| 2006/0156100 A1 * | 7/2006 | Boike et al. | .................. | 714/724 |

* cited by examiner

*Primary Examiner*—John P Trimmings
(74) *Attorney, Agent, or Firm*—Yee & Associates, P.C.

(57) ABSTRACT

An apparatus and method are disclosed for testing a hard macro that is embedded in a system on a chip (SOC) that is included in an integrated circuit chip. The SOC includes the hard macro. A logic design and operation of the hard macro are unknown. A test wrapper is embedded in the SOC. The test wrapper includes a scan chain. The test wrapper surrounds inputs and outputs of the hard macro. The test wrapper receives a known test data pattern in the scan chain that is included in the test wrapper. The hard macro receives from the test wrapper a set of non-test standard SOC inputs when the SOC is not in a test mode and receives the known test data pattern when the SOC is in the test mode. The hard macro generates a set of outputs in response to the inputs. The hard macro is tested utilizing the known test data pattern.

16 Claims, 3 Drawing Sheets

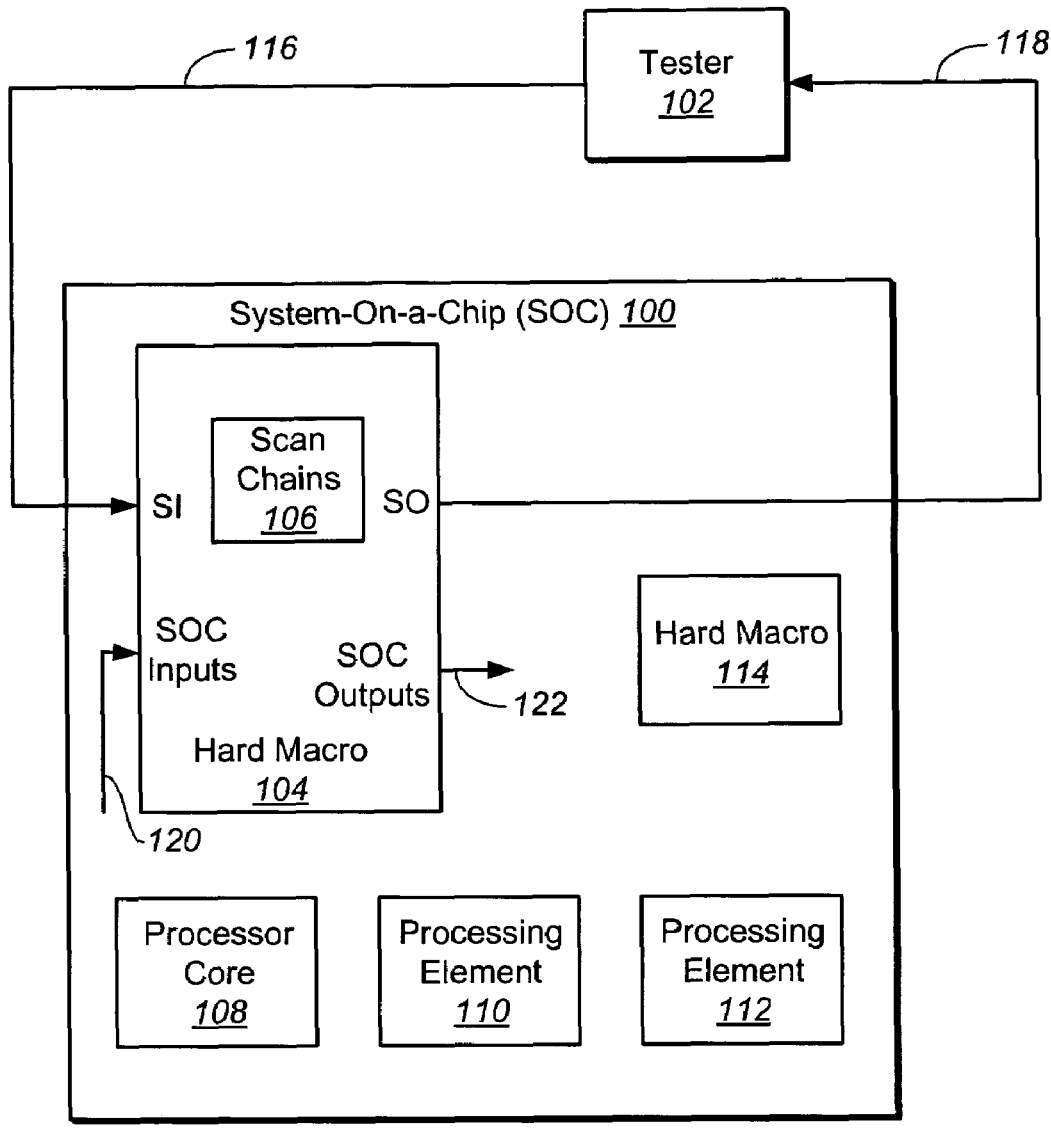
FIG._1 (PRIOR ART)

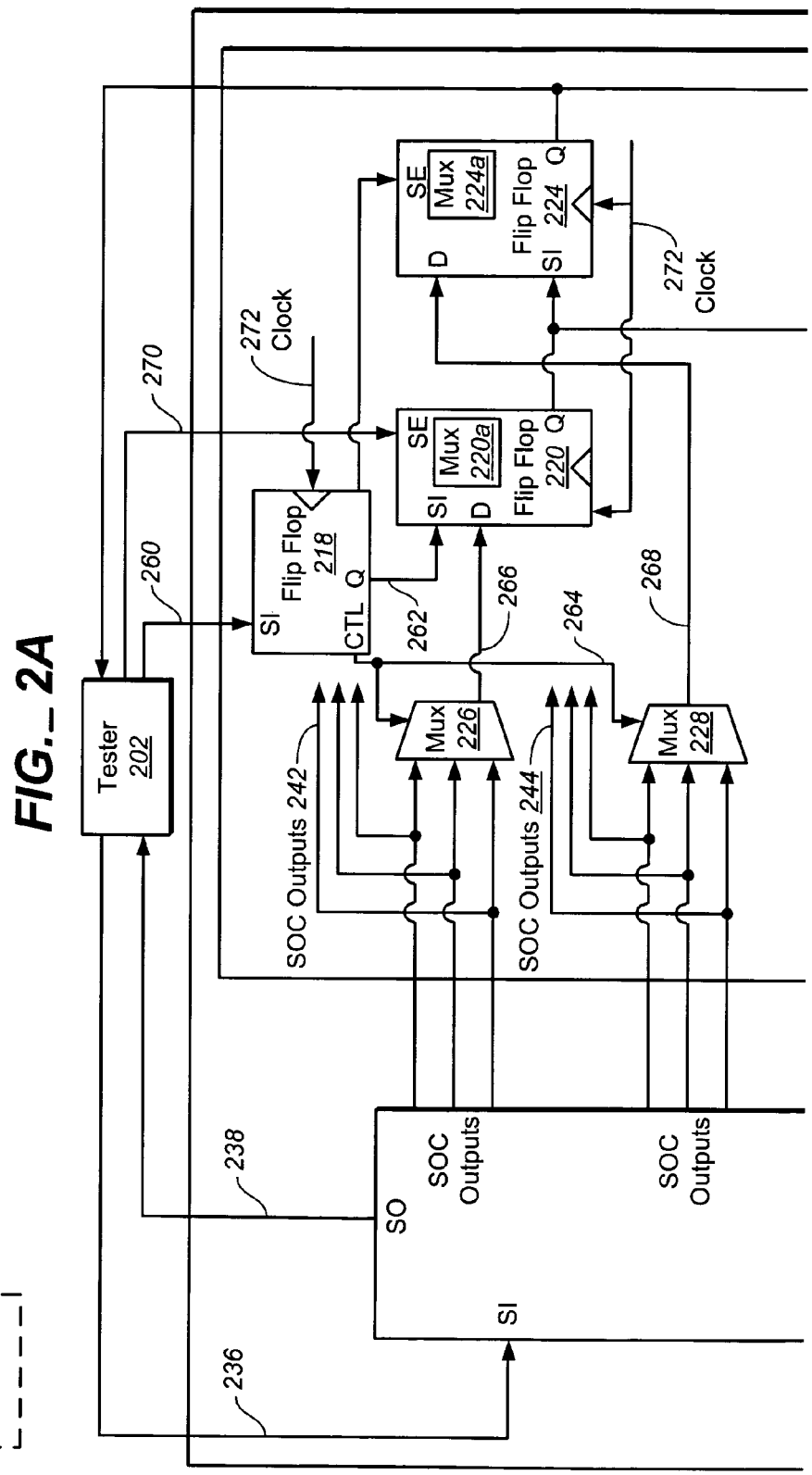

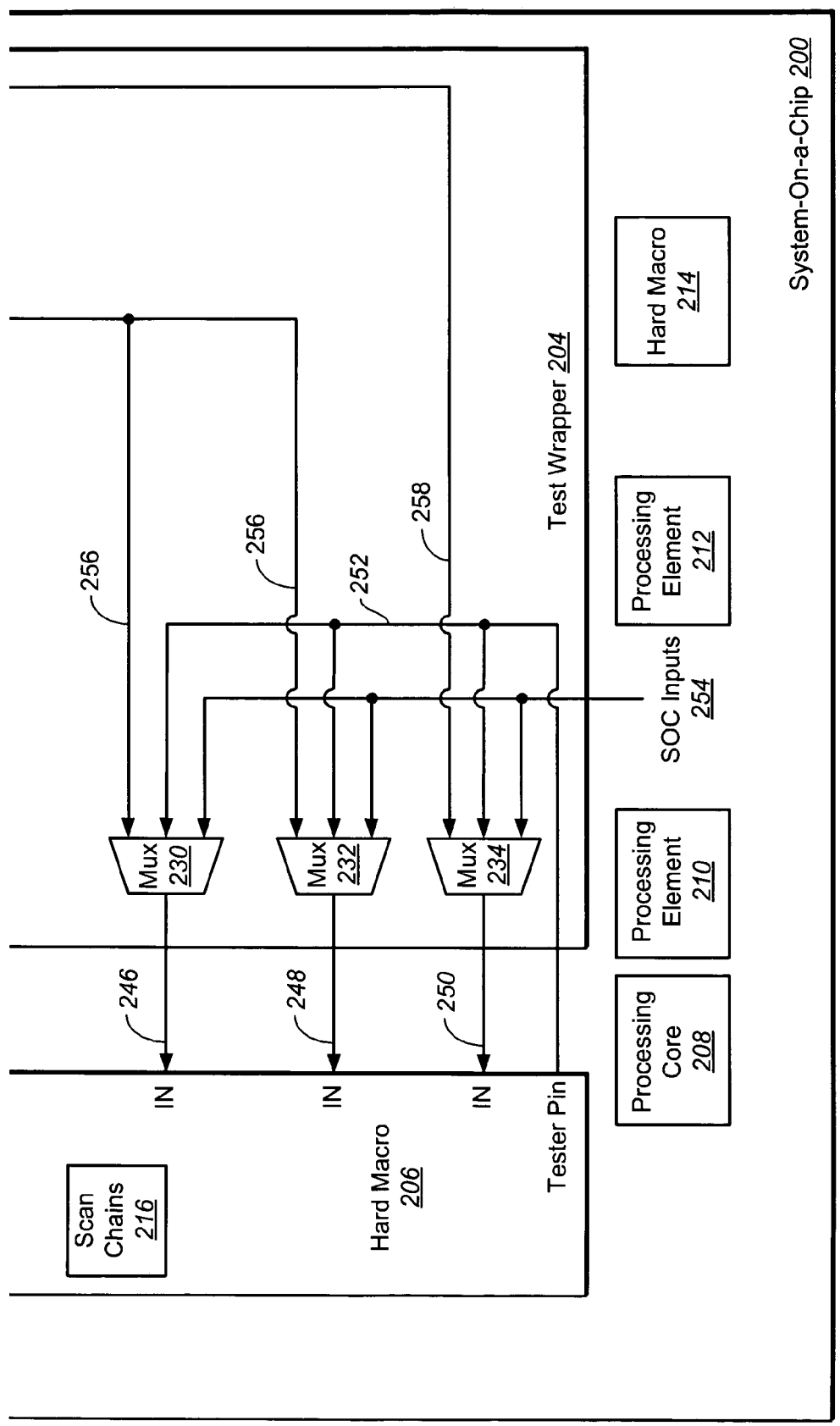
FIG._2B

TEST WRAPPER INCLUDING INTEGRATED SCAN CHAIN FOR TESTING EMBEDDED HARD MACRO IN AN INTEGRATED CIRCUIT CHIP

BACKGROUND OF THE INVENTION

1. Technical Field

The present invention is directed generally toward data processing devices. More particularly, the present invention relates to a method and apparatus for testing an embedded hard macro in an integrated circuit chip utilizing a test wrapper that surrounds the inputs/outputs of the hard macro.

2. Description of the Related Art

Customers purchase individual integrated circuit (IC) chips to include in their own larger devices that they then sell. For example, a customer may purchase a processor from the processor's manufacturer and then include that processor in a device that is manufactured and sold by the customer. These customers depend upon the reliability of processing cores, memory chips, hard macros, and the other integrated circuits that they purchase to function properly; otherwise, the device the customer sells will fail. Therefore, the customer will typically test the individual IC chips, purchased from other suppliers, during the manufacturing process of the customer's device.

The customer may test each IC chip to verify that the circuitry in the chip is functioning properly. One standard way for testing chips involves using an external memory tester at the customer's manufacturing site. An external memory tester supplies test patterns to the chip to detect faults in the chips.

One example of testing is scan-based testing. A component in the chip, such as a hard macro, is equipped with an externally accessible scan chain. The testing consists of scanning into the scan chain in the hard macro a sequence of test data. The scan chain includes multiple latch registers coupled together in a serial manner. The test data is shifted serially through these latch registers allowing information to be serially passed into and out of the scan chain. The scan chain allows for external control and examination of individual states of the hard macro that includes the scan chain and that is being tested.

There are automatic test pattern generation tools that generate patterns based on the design of the device. The manufacturer of the hard macro will typically provide a sample test pattern that the customer may use to test the hard macro. However, the sample test pattern will not exercise the hard macro in precisely the manner that it is to be used by the customer because the manufacturer of the hard macro does not know where or how the hard macro is to be used. Thus, it is possible that undetected defects may exist within the hard macro.

In order to for the customer to completely test the hard macro at the customer's site, the customer needs access to the logic design of the hard macro. However, the manufacturer of the hard macro does not typically make this design public. Thus, the customer does not have access to the internal logic diagrams of the hard macro. Because the customer does not know exactly how the hard macro is designed, the customer is not able to perform sufficiently complete testing. The customer would need access to the hard macro's logic diagrams or code in order to produce a test pattern that would completely test the hard macro. This logic or code is not made available to the customer.

FIG. 1 is a block diagram of a system on a chip (SOC) 100 that is coupled to a tester 102 in accordance with the prior art. SOC 100 includes a hard macro 104, a processor core 108, a processing element 110, a processing element 112, and a hard macro 114. SOC 100 may also include additional cores, processing elements, hard macros, and/or other devices or components. Although they are not depicted in the figure, SOC inputs are received by and SOC outputs are generated by processor core 108, processing element 110, processing element 112, hard macro 114, and all other additional cores, processing elements, hard macros, and/or other devices or components that are included within SOC 100.

A system on a chip is defined as being a single integrated circuit chip that includes on it a processing core as well as all of the components that are needed by the processing core.

A hard macro is a particular set of instructions. These instructions can be implemented in hardware or in software. As depicted by FIG. 1, these instructions are implemented within a hardware device such as a single integrated circuit or chip 104. One or more scan chains are included in hard macro 104. The scan chains 106 are provided within macro 104 for testing macro 104. A scan chain is a serial path that shifts test data from one device in the chain to the next device located serially in the chain.

As depicted by FIG. 1, an external tester 102 may be coupled to SOC 100 in order to test devices within SOC 100 such as macro 104. Hard macro 104 receives serial test data from tester via scan signal SI 116. This test data is scanned into scan chains 106 in order to test hard macro 104. The results of the test performed on macro 104 using the input signal SI are serially scanned out as captured result data. The captured result data is serially scanned out of scan chains 106 and is provided back to tester 102 as a scanned out signal SO 118. Tester 102 can then analyze the captured data to determine whether hard macro 104 is performing as it should and whether it has any manufacturing defects.

Therefore, a need exists for a method and apparatus for testing a hard macro that is embedded within a system on a chip in an integrated circuit chip. The needed method and apparatus tests the embedded hard macro utilizing a test wrapper that surrounds the inputs/outputs of the hard macro in order to permit a customer to perform sufficiently complete testing of the hard macro.

SUMMARY OF THE INVENTION

An apparatus and method are disclosed for testing a hard macro that is embedded in a system on a chip (SOC) that is included in an integrated circuit chip. The SOC includes the hard macro. A logic design and operation of the hard macro are unknown. A test wrapper is embedded in the SOC. The test wrapper includes a scan chain. The test wrapper surrounds inputs and outputs of the hard macro. The test wrapper receives a known test data pattern in the scan chain that is included in the test wrapper. The hard macro receives from the test wrapper a set of non-test standard SOC inputs when the SOC is not in a test mode and receives the known test data pattern when the SOC is in the test mode. The hard macro generates a set of outputs in response to the inputs. The hard macro is tested utilizing the known test data pattern.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a block diagram of a system on a chip (SOC) that is coupled to a tester that is external to the SOC in accordance with the prior art; and FIGS. 2A and 2B are a block diagram of a system on a chip (SOC) that is coupled to a tester that is external to the SOC, where the SOC includes a test wrapper for more accurately testing the SOC in accordance with the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention to enable others of ordinary skill in the art to understand the invention for various embodiments with various modifications as are suited to the particular use contemplated.

The present invention is a test wrapper for testing a hard macro that is embedded within a system on a chip (SOC). The test wrapper is included as part of the SOC embedded within the SOC's integrated circuit. The test wrapper provides a means for inputting a known test scan pattern into the hard macro and then capturing the resulting outputs once the hard macro has processed the known test pattern. The test wrapper includes a scan chain that is coupled to the standard outputs of the hard macro and that provides inputs to the hard macro.

The present invention provides several multiplexers that are used to reduce the circuit complexity and number of test components in the wrapper. By multiplexing SOC outputs together, the number of flip flops that is needed in the scan chain is reduced.

The same scan chain in the test wrapper is also used to drive multiplexers that are coupled to inputs of the hard macro. By funneling the outputs of the scan chain in close proximity to a command register and also driving multiple inputs from the same register, the amount of logic required for the test wrapper can be reduced to roughly the size of the scan chain output of the hard macro.

FIGS. 2A and 2B are a block diagram of a system on a chip (SOC) 200 that is coupled to a tester 202, where the SOC includes a test wrapper 204 for more accurately testing a hard macro 206 that is included within SOC 200 in accordance with the present invention. The test wrapper 204 is used to test a hard macro 206 where the design of the logic and operation of hard macro 206 is unknown.

SOC 200 includes a hard macro 206, a processor core 208, a processing element 210, a processing element 212, and a hard macro 214. SOC 200 may also include additional cores, processing elements, hard macros, and/or other devices or components.

The present invention is a test wrapper 204 that can be utilized to store a known input in scan chains 216 in order to better test hard macro 206 where the design of the logic and operation of hard macro 206 is unknown. Test wrapper 204 includes a flip flop 218, a flip flop 220, a flip flop 224, a multiplexer 226, a multiplexer 228, a multiplexer 230, a multiplexer 232, and a multiplexer 234. As will be obvious to those skilled in the art, hundreds of flip flops and multiplexers should be used to adequately test all of the logic included within hard macro 206. The depicted flip flops and multiplexers can be expanded to include hundreds of flip flops and multiplexers. However, in order to simplify the figures and the description, the present invention is described using only a few flip flops and multiplexers as shown. The present invention would operate in a similar manner in a test wrapper that included hundreds of flip flops and multiplexers.

Hard macro 206 receives serial test data from tester 202 via scan signal SI 236. This test data is scanned into scan chains 216 in order to test hard macro 206. Once hard macro 206 processes the test data, test result data is serially scanned out of scan chains 216 as captured test result data that is provided back to tester 202 as a scanned out signal SO 238.

Hard macro 206 receives SOC inputs 254 that are non-test inputs. These inputs are from the other components that are internal to SOC 200 and may be inputs received from outside of SOC 200. These inputs are depicted as the standard SOC inputs 254. Any input received within hard macro 206 that is not a test input, e.g. not SI input 236 or not an input generated by test wrapper 204 such as signal 256 or 258, is a standard SOC input 254. Although they are not depicted in the figure, SOC inputs are received by and SOC outputs are generated by processor core 208, processing element 210, processing element 212, hard macro 214, and all other additional cores, processing elements, hard macros, and/or other devices or components that are included within SOC 200.

After hard macro 206 receives SOC inputs 254, macro 206 attempts to execute its instructions as it is programmed to do using these inputs. Hard macro 206 generates the output of the execution of these instructions as SOC outputs 242 and 244. These outputs are designed to be distributed throughout various internal components of SOC 200 and may be distributed to output pins of SOC 200 to be received by devices that are not included in SOC 200.

When hard macro 206 is being tested, hard macro 206 receives a known test data pattern from test wrapper 204 as described in more detail below. Hard macro 206 executes its instructions using the known test data pattern, and then outputs its results of this execution as SOC outputs 242, 244. When hard macro 206 is not being tested, hard macro 206 receives SOC inputs 254; hard macro 206 executes its instructions using SOC inputs 254, and then outputs its results of this execution as SOC outputs 242, 244. In this manner, SOC outputs 242, 244 may be either standard outputs when SOC 200 is in a non-test mode or test results when SOC 200 is in a test mode.

In addition to the standard SOC inputs 254, SOC outputs 242, 244, SI signal 236, and SO signal 238, hard macro 206 also receives input signals IN 246, IN 248, and IN 250. These input signals are received from multiplexers 230, 232, and 234, respectively.

Multiplexer 230 receives as its inputs a control signal 252 that is output from a tester pin that is included within hard macro 206, and data signals SOC inputs 254 and signal 256 that is the data output from flip flop 220. Multiplexer 232 receives as its inputs a control signal 252, and data signals SOC inputs 254 and signal 256. Multiplexer 234 receives as its inputs a control signal 252, and data signals SOC inputs 254 and a signal 258 that is that data output from flip flop 224.

Control flip flop 218 receives as its input a scan signal SI 260. Flip flop 218 generates a data output Q signal 262 that is received as an input data signal into flip flop 220. This signal 260 includes a forced, known serial chain of test data that is serially scanned into flip flop 220. Control flip flop 218 also generates a control signal CTL 264 that is received within multiplexer 226 and multiplexer 228.

Multiplexer 226 receives as data inputs the SOC outputs 242. Multiplexer 228 receives as data inputs the SOC outputs 244. Control signal CTL 264 from flip flop 218 is used to select one of SOC outputs 242 to use as the output signal 266 of multiplexer 226. Control signal CTL 264 from flip flop 218 is also used to select one of SOC outputs 244 to use as the output signal 268 of multiplexer 228.

Flip flop 220 receives as its data inputs signal 262 from flip flop 218 and data signal 266 from multiplexer 226. A select enable signal 270 is input into a multiplexer 220a that is included within flip flop 220 and input into a multiplexer 224a that is included within flip flop 224. Select enable signal 270 is used by flip flop 220 to select either input signal 262 or signal 266 to use as the output Q signal 256 of flip flop 220.

Flip flop 224 receives as its data inputs signal 268 that is output from multiplexer 228 and output signal Q 256 from flip flop 220. Select enable signal 270 is used by flip flop 224 to select either input signal 256 or signal 268 to use as the output Q signal 258 of flip flop 224.

Flip flops 218, 220, and 224 are clocked by a clock 272.

Multiplexers 226, 228, 230, 232, and 234 are provided in order to reduce the circuitry that is needed within test wrapper 204. By using these multiplexers, fewer flip flops are required.

When SOC 200 is coupled to tester 202 and when tester 202 is in scan mode, the output of the tester pin of hard macro 206 is asserted thus outputting a logic HIGH level. Thus, signal 256 is asserted and active when SOC 200 and tester 202 are attached. When SOC 200 is in a normal non-test mode on a customer's PCB, SOC 200 is not attached to tester 202. Thus, the output of the tester pin is not asserted and is outputting a logic LOW level. At this time, signal 256 is not asserted. Signal 256 is used to select a particular input into multiplexers 230, 232, and 234. When signal 256 is not asserted, i.e. when tester 202 is not attached to SOC 200, the standard SOC inputs 254 are selected and the outputs of multiplexers 230, 232, and 234 will be the standard SOC inputs 254.

When SOC 200 is in a test mode, SOC 200 is attached to tester 202 and tester 202 is in scan mode. Thus, the output of the tester pin is asserted and is outputting a logic HIGH level. At this time, signal 256 is asserted. When signal 256 is asserted, i.e. when tester 202 is attached to SOC 200, the known tester scan chain data inputs are selected by the multiplexer. Thus, the outputs of multiplexers 230 and 232 will be signal 256 which is the data output of flip flop 220. The output of multiplexer 234 will be signal 258 which is the data output of flip flop 224.

When tester 202 enters scan mode, it transmits test scan data into scan chains 216 of hard macro 206 via scan input signal 236. Tester also asserts scan enable signal 270 when it is in scan mode. Tester 202 then exits scan mode and enters capture mode to capture the results of the test. Scan chains 216 process this test data and output the results of the test via scan out signal 238. Tester 202 then captures this data for analysis.

In addition, in accordance with an important feature of the present invention, tester 202 transmits known test scan data into the scan chain, that consists of flip flops 220 and 224, via scan input signal 260. Scan input signal 260 is input into control flip flop 218. When control flip flop 218 receives scan test data, it outputs the scan test data using its Q output signal 262. Signal 262 is received within flip flop 220. When tester 202 is in scan mode, tester 202 asserts scan enable signal 270. When scan enable signal 270 is asserted, multiplexer 220a causes flip flop 220 to select signal 262 as its output signal 256 by causing flip flop 220 to take the data that is input via its SI pin and propagating it to its Q pin after the rising edge of clock 272. In addition, multiplexer 224a causes flip flop 224 to select signal 256 as its output signal 258 by causing flip flop 224 to take the data that is input via its SI pin and propagating it to its Q pin after the rising edge of clock 272.

Thus, when tester 202 is in scan mode, the known test scan data will be serially shifted through test wrapper's 204 scan chain and then input into hard macro 206. Hard macro 206 will execute its instructions using this known test data and then generate an output via SOC outputs 242 and 244. This output represents the results of the execution within hard macro 206 of the test data. Tester 202 will then capture this output of hard macro 206 to analyze whether hard macro 206 is operating correctly.

As depicted, the test wrapper's scan chain includes flip flops 220 and 224. Those skilled in the art will recognize that in practice, hundreds or thousands of flip flops may be included in the test wrapper's scan chain.

Thus, during scan mode, the test wrapper's scan chain includes a known test scan pattern. In addition, because tester pin is asserted during scan mode, multiplexers 230 and 232 select input signal 256 to use as their output and multiplexer 234 selects input signal 258 to use as its output. In this manner, during scan mode, a known test scan pattern is input into hard macro 206 via the test wrapper's scan chain.

When the tester exits scan mode, tester pin signal 242 is not asserted. At this time multiplexers 230, 232, and 234 will select the normal SOC inputs 254 to use as their output signals. Also at this time, scan enable 270 is not asserted causing flip flop 220 and flip flop 224 to select the data on their data pins D to propagate as their outputs via their Q output pins.

When tester 202 exits scan mode after it has scanned in a known scan test data pattern, tester 202 enters capture mode. During capture mode, flip flops 220 and 224 store the results of the execution by hard macro 206 of the known test data. These results are serially clocked out from hard macro 206 as SOC outputs 242, 244 and into flip flops 220, 224. Eventually these results are output from flip flop 224 and received within tester 202.

During capture mode, flip flop 218 uses control signal CTL 264 to cause multiplexer 226 to rotate among the various SOC outputs 242 to use as the output 266 of multiplexer 226. Flip flop 218 also uses control signal CTL 264 to cause multiplexer 228 to rotate among the various SOC outputs 244 to use as the output 268' of multiplexer 228. When tester 202 is in capture mode, scan enable 270 is not asserted so that flip flop 220 selects signal 266 to provide as its output 256. When scan enable 270 is not asserted, flip flop 224 selects signal 268 to use as its output 258. Output 258 is provided to tester 202 as the captured results of the test.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system on a chip (SOC) comprising:
a plurality of logic cores and processing elements; and
an apparatus embedded in the SOC, the apparatus interfacing to the plurality of logic cores and processing elements in the SOC, the apparatus comprising:

a hard macro, wherein an interface of the hard macro comprises SOC input and output (I/O) pins, a scan in pin, a scan out pin, and a test pin;

a test wrapper surrounding the hard macro interface, the test wrapper shifting a known test data pattern for input to the hard macro interface during a test mode, wherein the test wrapper comprises input and output pins that interface to the hard macro interface, and a plurality of flip flops and multiplexers only; and a scan chain in the test wrapper, the scan chain comprising a series of flip-flops that shifts the known test data pattern through the multiplexers in the test wrapper that output data through, the hard macro interface into the hard macro in a test mode of the SOC.

2. The SOC of claim 1, wherein:

the test wrapper of the apparatus scans the known test data pattern into the inputs of the hard macro interface; and the test wrapper captures a result from the outputs of the hard macro interface based on the known input test data pattern.

3. The SOC of claim 1, wherein the SOC output pins output a standard output in a non-test mode of the SOC and test results in a test mode of the SOC.

4. The SOC of claim 1, wherein:

the test wrapper further comprises one control flip flop that generates a control signal and a serial output that comprises the known test data pattern, the control flip flop enabling a selection of a particular input into each one of the series of flip flops, the particular input being at least one of the known test data pattern and a set of outputs from the hard macro interface.

5. The SOC of claim 1, wherein the SOC interfaces to an external tester; and an output of the test pin is asserted when the SOC is coupled to the external tester and when the tester is in a scan mode and not asserted when either the SOC is not coupled to the tester or the SOC is coupled to the tester but the tester is in a capture mode;

wherein the hard macro interface receives from the test wrapper the known test data pattern when the output of the test pin is asserted; and wherein the hard macro interface receives from the test wrapper the set of non-test standard SOC inputs when the output of the test pin is not asserted.

6. The SOC of claim 5, wherein:

the tester is coupled to the SOC upon entering a scan mode;

the scan chain receives from the tester the known test data pattern when the tester enters scan mode; and the scan chain serially scans the known test data pattern into the interface of the hard macro during the scan mode of the tester.

7. The SOC of claim 6, wherein:

the hard macro comprises internal logic that is not known and accessible.

8. The SOC of claim 1, wherein:

the test wrapper receives a set of non-test SOC inputs and forwards the non-test SOC inputs to the hard macro interface without altering the non-test SOC inputs when the SOC is not in a test mode.

9. The SOC of claim 1, wherein:

the test wrapper includes a plurality of multiplexers.

10. A method for testing a system on a chip (SOC), the SOC comprising, a test wrapper surrounding an interface of a hard macro, the test wrapper comprising a scan chain, the method comprising:

receiving, by the test wrapper, a known test data pattern;

receiving, to the interface of the hard macro, a set of non-test standard SOC inputs through the test wrapper when the SOC is not in a test mode and receiving the known test data pattern when the SOC is in the test mode, the interface of the hard macro including a test pin; and testing the hard macro utilizing the known test data pattern.

11. The method of claim 10, further comprising:

scanning, by the test wrapper, the known test data pattern into the hard macro through the hard macro interface; and capturing, by the test wrapper, a result of the outputs of the hard macro interface.

12. The method of claim 10, further comprising:

storing the known test data pattern in the scan chain, the scan chain including a series of registers.

13. The method of claim 10, wherein the test wrapper further comprises a tester that is external to the SOC, wherein the hard macro interface further comprises the test pin, and wherein the method further comprises:

receiving, by the hard macro interface from the test wrapper, the known test data pattern when the output of the test pin outputs a logic HIGH level; and receiving, by the hard macro interface from the test wrapper, the set of non-test standard SOC inputs when the output of the test pin outputs a logic LOW level.

14. The method of claim 13, wherein the tester is coupled to the SOC and wherein the method further comprises:

entering the scan mode in the tester;

receiving, by the scan chain from the tester, the known test data pattern when the tester enters scan mode; and serially scanning, by the scan chain, the known test data pattern into the inputs of the hard macro interface when the tester is in the scan mode.

15. The method of claim 10, further comprising:

receiving, by the test wrapper, a set of non-test SOC inputs; and forwarding the non-test SOC inputs to the inputs of the hard macro interface without altering the non-test SOC inputs when the SOC is not in a test mode.

16. The method of claim 10, wherein a number of required registers in the scan chain is reduced by an inclusion of a plurality of multiplexers in the test wrapper.

* * * * *